United States Patent
Bhattacharjee et al.

(10) Patent No.: US 9,716,515 B2
(45) Date of Patent: Jul. 25, 2017

(54) METHOD FOR DETECTING END OF RECORD IN VARIABLE LENGTH CODED BIT STREAM

(71) Applicant: International Business Machines Corporation, Armonk, NY (US)

(72) Inventors: Deepankar Bhattacharjee, Bangalore (IN); Jonathan D. Bradbury, Poughkeepsie, NY (US); Christian Jacobi, Poughkeepsie, NY (US); Aditya N. Puranik, Bangalore (IN); Christian Zoellin, Boeblingen (DE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/967,608

(22) Filed: Dec. 14, 2015

(65) Prior Publication Data
US 2017/0170844 A1 Jun. 15, 2017

(51) Int. Cl.
*H03M 7/40* (2006.01)
*H03M 7/42* (2006.01)
(52) U.S. Cl.
CPC .................................. *H03M 7/425* (2013.01)
(58) Field of Classification Search
CPC ............. H03M 13/1515; H03M 13/29; H03M 13/2909; H03M 13/293; H03M 5/145; H03M 7/42; H03M 7/40; H03M 7/4031; H03M 7/00; H03M 5/00; H02M 7/425

USPC ......................................... 341/67, 50, 51, 59
See application file for complete search history.

(56) References Cited

U.S. PATENT DOCUMENTS

| | | | |
|---|---|---|---|
| 5,280,600 A | 1/1994 | Van Maren et al. | |
| 5,442,350 A | 8/1995 | Iyer et al. | |
| 5,566,192 A | 10/1996 | Moon | |
| 5,608,740 A * | 3/1997 | Watanabe | H03M 13/1515 714/755 |
| 5,686,916 A | 11/1997 | Bakhmutsky | |
| 5,821,883 A * | 10/1998 | Chiba | G11B 20/10009 341/59 |
| 7,848,297 B2 * | 12/2010 | Kyung | H04W 72/005 370/335 |
| 8,630,354 B2 | 1/2014 | Jahanghir et al. | |
| 8,718,098 B2 * | 5/2014 | Zhang | H04W 28/06 370/477 |
| 2010/0107027 A1 * | 4/2010 | Tsutsumi | H03M 7/40 714/747 |

* cited by examiner

*Primary Examiner* — Jean B Jeanglaude
(74) *Attorney, Agent, or Firm* — Cantor Colburn LLP; Steven Chiu

(57) ABSTRACT

Modifying a digital data stream that includes immediately consecutive code words of different length by segmenting, based on a certain block grid, the digital data stream. Each block of the block grid includes a fixed number of bits. It is determined whether all bits of the last block associated with the digital data stream are occupied by data of the digital data stream. If not all bits of the last block are occupied, the unoccupied bits of the last block are padded with bits of an end-of-record (EOR) indicator. If all bits of the last block are occupied, attaching an EOR indicator to the digital data stream is skipped.

20 Claims, 5 Drawing Sheets

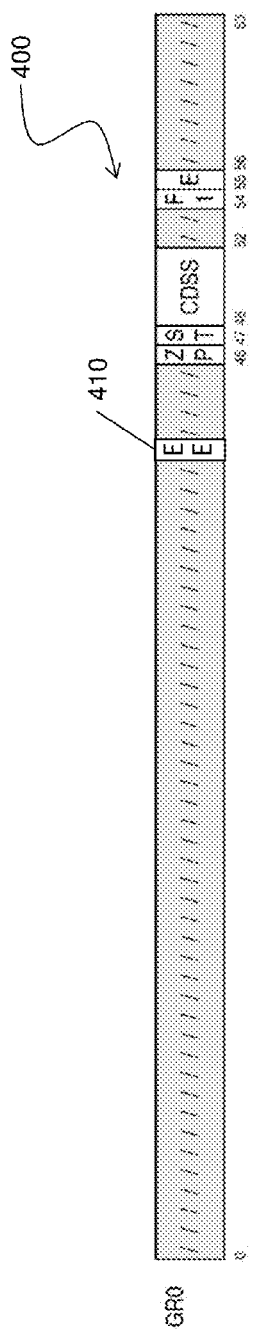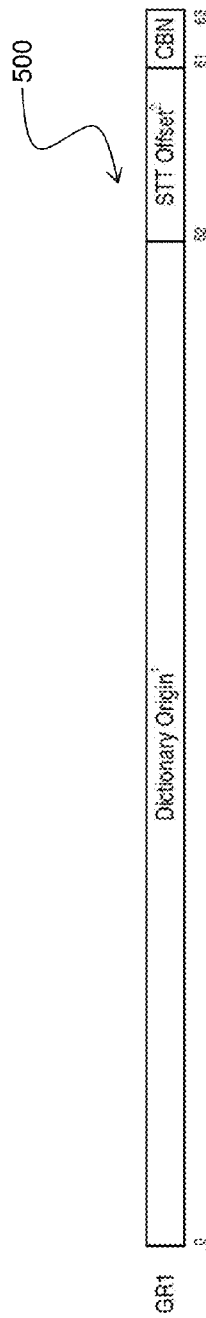

METHOD FOR DETECTING END OF RECORD IN VARIABLE LENGTH CODED BIT STREAM

BACKGROUND

The present invention relates generally to decoding variable length coded data, and more specifically to modifying a data stream by adding end of record (EOR) information and to detecting the end of an encoded data stream based on EOR information.

SUMMARY

Embodiments include a method, system, and computer program product for modifying a digital data stream that includes immediately consecutive code words of different length. The method includes segmenting, based on a certain block grid, the digital data stream, each block of the block grid comprising a fixed number of bits. It is determined whether all bits of the last block associated with the digital data stream are occupied by data of the digital data stream. If not bits of the last block are occupied, the unoccupied bits of the last block are padded with bits of an end-of-record (EOR) indicator. If all bits of the last block are occupied, attaching an EOR indicator to the digital data stream is skipped.

Embodiments further include a method, system and computer program product for decoding an encoded data stream that includes immediately consecutive code words of different length. The method includes receiving an encoded data stream with a certain length, the encoded data stream including multiple immediately consecutive code words of different length. The encoded data stream is processed in order to detect valid code words. The detected valid code words are decoded. At the end of the data stream, it is investigated to see whether an end data portion is detected which is associated with the beginning portion of an EOR indicator or whether an EOR indicator should be added to the end of the data stream. The decoding process of the data stream is terminated if a beginning portion of an EOR-indicator or a complete EOR-indicator is detected at the end of the data stream.

According to a further aspect, systems and computer program products for modifying or decoding of a data stream are provided. The computer program products comprise a computer readable storage medium having program instructions embodied therewith, the program instructions executable by a processor to cause the processor to execute a method according to one of the above-mentioned aspects. The systems comprise memory having computer readable instructions and one or more processors for executing the computer readable instructions to cause the processor to execute a method according to one of the above mentioned aspects.

Additional features and advantages are realized through the techniques of the present invention. Other embodiments and aspects of the invention are described in detail herein and considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 5 illustrates a first processor register of a processor configured to decode an encoded data stream, in accordance with some embodiments of this disclosure; and FIG. 6 illustrates a second processor register of a processor configured to decode an encoded data stream, in accordance with some embodiments of this disclosure.

DETAILED DESCRIPTION

Figure 1:
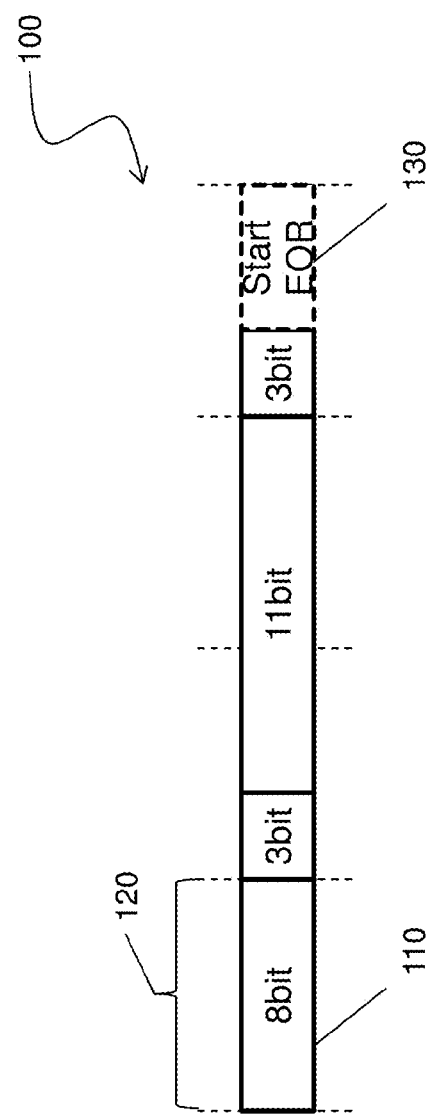
FIG. 1 depicts a data stream comprising multiple data blocks including variable length code words and a partial EOR indicator, in accordance with some embodiments of this disclosure.

Embodiments of the present disclosure provide for detecting an end of record condition in variable length coded bit streams.

Embodiments include a method for modifying a digital data stream that includes immediately consecutive code words of different length.

According to an embodiment of the method for modifying a digital data stream, the size of the block is a byte comprising 8 bits. Typically, the granularity of a storage medium is byte, i.e. the encoded data stream is padded such that the encoded data stream (including the padded bits) exactly fits into a set of one or more bytes. Thereby, a resource-efficient termination of the encoded data stream can be achieved.

According to an embodiment of the method for modifying a digital data stream, a prefix-free code is used for coding the code words. Prefix-free codes are characterized in that no valid code word is the prefix (initial code word segment) of any other code word. Thereby, the detection of the end of record (EOR) prefix as being associated with the EOR indicator could be significantly simplified.

According to an embodiment of the method for modifying a digital data stream, padding is performed by including two or more bits of the same bit value. In other words, the EOR indicator is constituted by a set of ones (all-ones, e.g. 1111111) or a set of zeros (all-zeros, e.g. 0000000). Using an EOR indicator comprising only ones or only zeros can be advantageous because the probability of detecting the prefix of such EOR indicator is significantly improved.

According to an embodiment of the method for modifying a digital data stream, padding is performed by including two or more bits of a given bit sequence, said bit sequence being indicative for the EOR indicator. Said bit sequence may comprise a predetermined sequence of ones and zeros.

According to an embodiment of the method for modifying a digital data stream, the modified data stream is stored in a storage having a storage granularity according to the block size. Due to said padding of the data stream, the length of the encoded data stream is adapted to the block size of the storage such that also the last block associated with the data stream is completely occupied (e.g. by a mixture of bits of a code word followed by bits of the EOR).

Embodiments include a method for decoding an encoded data stream that includes immediately consecutive code words of different length.

According to an embodiment of the decoding method, data blocks of the data stream comprising multiple bits are investigated in order to determine whether said data block contains a valid code word. In other words, a block-wise decoding processing is performed wherein multiple bits of the encoded data stream are investigated if they correspond to a valid code word. Thereby, the decoding performance can be significantly improved, and specifically, the decoding time can be reduced.

According to an embodiment of the decoding method, the investigation regarding a valid code word is performed based on a look-up table or based on arithmetic operations and comparisons. By comparing a set of bits of the encoded data stream with a look-up table or applying arithmetic operations on said set of bits, it is determined whether said set of bits corresponds to a certain code word. Said determination is supported by the fact that a prefix-free code may be used.

According to an embodiment of the decoding method, said data blocks comprise a length equal to the length of the largest code word. In other words, during decoding processing, data blocks are considered which have a length equal to the largest code word. Thereby it is possible to detect all valid code words within the data block.

According to an embodiment of the decoding method, the investigation regarding a valid code word is performed bit-wise based on a code tree by moving along the code tree until a leaf of the code tree is reached which refers to a valid code word. In other words, during decoding, the number of investigated bits is increased as long as the set of bits forms a valid code word. After detecting a valid code word based on the code tree, said code word is decoded.

According to an embodiment of the decoding method, at the end of the data stream it is investigated whether a leaf of the code tree is reached which is associated with a valid code word, respectively, the EOR indicator or whether the data stream ends at a point within the code tree which is on a branch towards the EOR indicator. In case that a valid code word is detected, said code word is decoded. If a complete EOR indicator is detected, it is recognized that the last valid code word ended in front of said EOR indicator. If a bit sequence is recognized which corresponds to the beginning of the EOR, it is decided that said bit sequence is the prefix of the EOR indicator and the decoding of the data stream is stopped. It is worth mentioning that the decoding method has knowledge that the last block of data stream is reached (because the data stream was received by requesting a certain number of blocks from a storage device). Thereby, the risk of erroneously deciding that the bit sequence within the last block of the data stream is the prefix of the EOR could be minimized.

According to an embodiment of the decoding method, the code words are coded by using a prefix-free code. Said kind of code can be advantageous because in the case of detecting a bit sequence associated with a valid code word, it can be excluded that said bit sequence is the start of another (longer) code word, which could significantly improve the detection quality.

According to an embodiment of the decoding method, the received encoded data stream is buffered, for example, in a look-ahead buffer. Thereby, a decoupling of the process of reading the encoded data out of a storage device and decoding the encoded data stream may be possible.

Embodiments of the present invention may be a system, a method, and/or a computer program product. The system may include a memory having computer readable instructions, and one or more processors for executing the computer readable instructions to carry out aspects of embodiments of the present invention. The computer program product may include a computer readable storage medium (or media) having computer readable program instructions thereon for causing a processor to carry out aspects of embodiments of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

FIG. 1 illustrates a schematic representation of an exemplary data stream 100 in accordance with an embodiment. For example, the data stream 100 results from a read instruction provided to a storage device and the storage device may be any storage medium mentioned before, i.e. a volatile or non-volatile storage medium. Storage media often work block-oriented, i.e. the data are stored as blocks 120 of bits based on a certain block grid. Such block 120 of data may comprise multiple bits, for example 8 bits, i.e. each block 120 may have the size of 8 bits. The transmission of said data stream 100 may be triggered due to a read command, said read command indicating a start address of the desired data and the number of blocks to be read out.

The data stream 100 comprises coded information. The coded information is included in code words 110 which are consecutively arranged within the data stream 100. In other words, the end bit of a first code word 110 is directly followed by a start bit of a second code word 120. The code words 110 are obtained by coding data using a variable length code, i.e. a code is used which maps source symbols to a variable number of bits (also called entropy encoding). For example, the variable length code may be Huffman code, Lempel-Ziv code or arithmetic code. In an embodiment, the code is a prefix-free code. As shown in FIG. 1, the code words 110 may span over the boundary between successive blocks 120, i.e. a certain code word may start in a first block 120 and may end in a further block 120 which follows said first block 120. In case that the block is a byte, the block 120 may span over two or more bytes.

Figure 2:
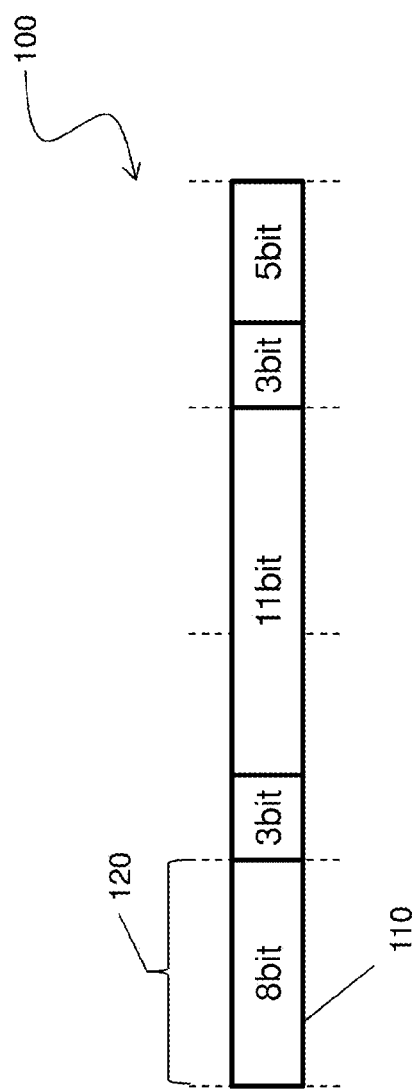
FIG. 2 depicts a data stream comprising multiple data blocks including variable length code words, in accordance with some embodiments of this disclosure.

In order to match the length of data stream to the block size, an EOR indicator 130 may be used for padding the last block such that the bits of the last block 120 which are not occupied by a code word are filled by bits associated with an end of record (EOR) indicator 130. Said padding may be performed in a coder being configured to generate the code words 110 based on a non-encoded data stream. The coder may generate consecutive code words of different length and add one or more bits of an EOR indicator (i.e. a partial EOR) if the length of the coded data stream does not fit to the block grid. In other words, not an EOR having a fixed length is added to the encoded data stream 100 but a truncated EOR may be attached to the end of the encoded data stream 100 in order to replenish the last block 120. As shown in FIG. 2, in case that the encoded data stream matches exactly to the block grid (i.e. the last bit of the encoded data stream is the last bit in a block) said padding is skipped (i.e. no bits of the EOR indicator are added).

The EOR indicator may comprise a set of identical bits, i.e. may comprise all zeros or all ones. According to other embodiments, the EOR indicator may be constituted by a fixed binary number containing zeros and ones. The EOR indicator may comprise a certain number of bits and—depending of the non-occupied bits in the last block 120 of the data stream 100—a truncated EOR is added to the data stream such that the last block 120 is completely filled up. By using a truncated EOR indicator for padding the last bits of a not completely occupied block, an end of data stream marking is possible without increasing the required memory space (i.e. the number of blocks occupied in the storage medium is kept constant).

Turning to the decoder, am embodiment of the decoder is adapted to decode the code words of the encoded data stream 100 and configured to detect the end of the last valid code word included in the data stream by recognizing one or more start bits of the EOR indicator (if any EOR indicator is included in the last block 120 of the data stream 100 at all).

Figure 3:
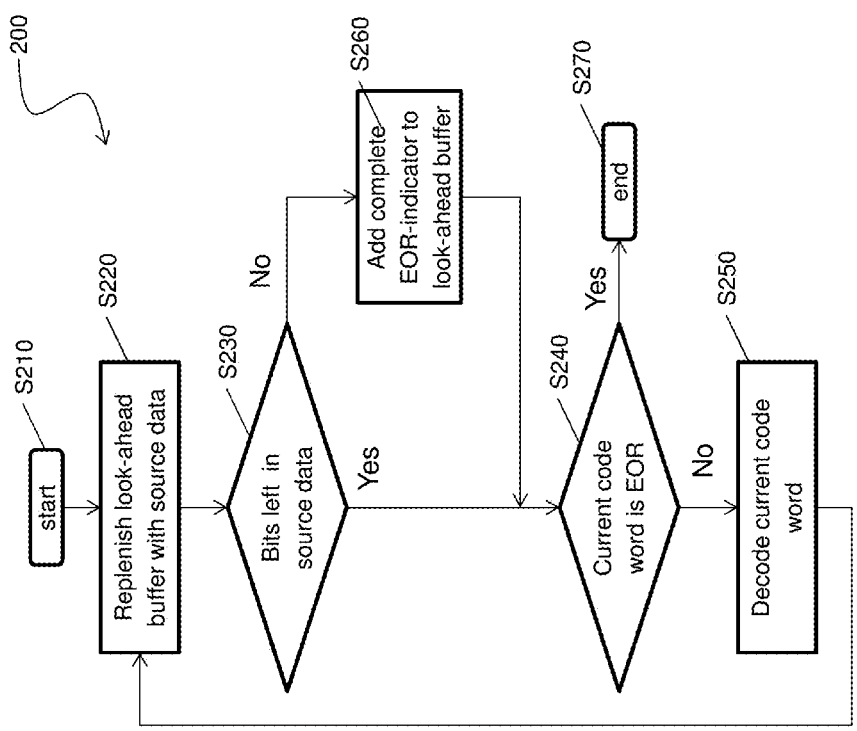
FIG. 3 illustrates a first embodiment of a method for decoding an encoded data stream comprising a partial EOR indicator.

FIG. 3 shows an example flow chart illustrating a first embodiment of a method 200 for decoding a data stream encoded with a variable length code wherein non-occupied blocks are padded by EOR bits (truncated EOR indicator). After starting the decoding process at step S210, the encoded data stream is read out of the storage device. The whole encoded data stream or only a portion of the data stream may be buffered. For example, a portion of the received data stream is buffered in a look-ahead buffer at step S220.

The buffered data are read out of the buffer block-wise, wherein the length of data blocks is associated with the length of the longest code word. In other words, data blocks are read out of the buffer which comprises a number of bits equal or greater than the number of bits of the longest code word. It is worth mentioning that the block size of the block grid which is used for storing the data in the storage device can be different to the size of the data block which is used for decoding code words 110. In step S230 it is checked whether further bits of the encoded data stream (i.e. further source data) are available. Said check may be performed based on information how may blocks 120 (e.g. bytes) are comprised within the data stream. If further source data are available, said read-out data block is analyzed whether said data block comprises an EOR indicator at step S240. If not (because the last block of the data stream has not been reached), the data block being read-out of the buffer is analyzed regarding containing a valid code word. Said analyzing may be performed based on a look-up table containing all valid code words and, for each valid code word, a value associated said code word. According to another embodiment, the detection of valid code words may be performed by arithmetic operations (addition and/or subtraction) and comparison, for example as disclosed by J. Brian Connell, "A Huffman-Shannon-Fano Code", Proc. of the IEEE, July 1973, pp. 1046-1047, or Alistair Moffat and Andrew Turpin, "On the Implementation of Minimum Redundancy Prefix Codes", IEEE Transactions on Communications, Vol. 45, No. 10, October 1997, pp. 1200-1207, the cited documents hereby incorporated by reference in their entirety. Thereby, the code words are decoded at step S250.

After decoding the code word, the buffer may be replenished with source data again at step S220 and a check is made whether the end of the source data is reached. If so, a complete, non-truncated EOR indicator (comprising nominal length of EOR indicator) is added to the end of the encoded data stream (S260). Thereby, independent of if any EOR bits have been added to the data stream by the coder due to block padding, the data stream comprises at least as much EOR bits as included in the non-truncated EOR indicator (or more, due to EOR bit padding). Thereby, in step S240, an EOR indicator is detected and the decoding process is stopped at step S270.

Figure 4:
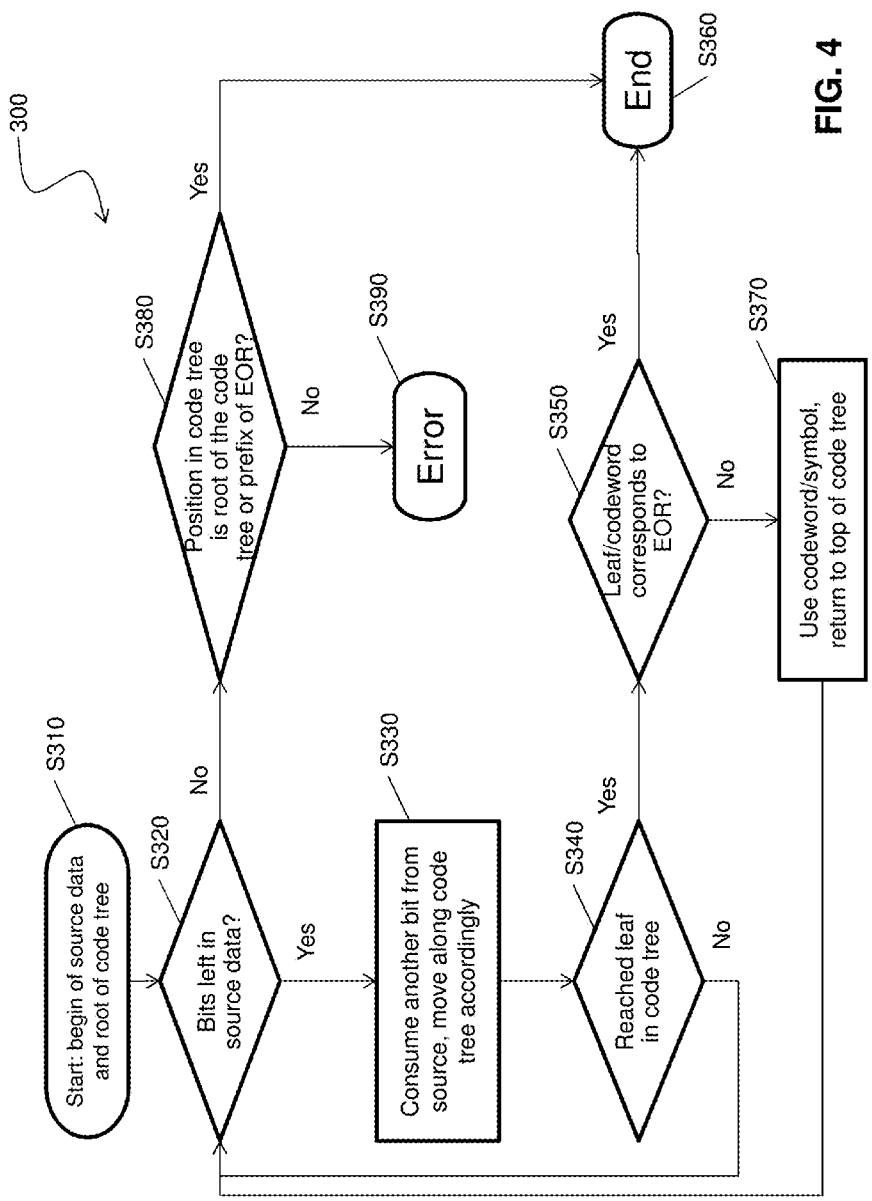
FIG. 4 illustrates a second embodiment of a method for decoding an encoded data stream comprising a partial EOR indicator.

FIG. 4 shows an example flow chart illustrating a second embodiment of a method 300 for decoding a data stream encoded with a variable length code wherein non-occupied blocks are padded by EOR bits (truncated EOR indicator) in accordance with an embodiment. Said method is based on a bit-wise processing of the encoded data stream 100, whereas the upper-described embodiment uses a block-wise processing. Detecting valid code words and decoding said code words is based on a code tree comprising a root and a plurality of branches. The free ends of said branches (also referred to as leaves) are associated with valid code words or a prefix-free code, respectively, with an EOR-indicator (e.g. comprising multiple zeros (all-zero) or multiple ones (all-ones)).

After receiving an encoded data stream 100, the method starts at step S310 at the start bit of the data stream and at the root of said code tree. For example, the encoded data stream 100 may be stored in a buffer, e.g. a look-ahead buffer. After starting the decoding process, it is checked whether further bits are available in the source data at step S320. In other words, there is a check whether the current bit to be processed is the last bit of the data stream. If there are further bits available, said current bit is processed by moving along the code tree according to the bit value at step S330.

After moving along the code tree according to the bit value it is checked whether a leaf in the code tree (i.e. a free end of a branch of the code tree) is reached at step S340. If no leaf was reached, the method returns to step S320 and checks whether further bits are available. Otherwise (a leaf has been reached), it is investigated whether the reached leaf corresponds to the EOR indicator at step S350. If so, the method is stopped at step S360 because the EOR indicates that the end of the encoded data stream 100 has been reached. If the reached leaf does not correspond to the EOR, the leaf is associated with a certain code word and said code word is decoded based on information included in the code tree at step S370. The method returns to step S320 in order to investigate whether further bits included in the encoded data stream 100 have to be processed.

If the last bit of the data stream 100 has been processed, the method investigates if the actual position is the code tree is root or the already processed bit sequence corresponds to the prefix of the EOR indicator at step S380. If the actual position in the code tree is the root of the code tree, the last processed bit formed the last bit of a valid code word and the last bit of a valid code word matched with a boundary of the block grid. If the last bit(s) refer(s) to the prefix of the EOR (i.e. the last bit(s) refer(s) to the beginning of the EOR indicator) it is investigated that the last block of the data stream has been padded by EOR bits. In said cases, the method terminates regularly at step S360. If the last bit(s) neither refer to the prefix of the EOR nor the actual position in the code tree is the root, an error is detected at step S390.

FIG. 5 illustrates the structure of a processor register 400, said processor being adapted to decode an encoded data stream 100 being padded by one or more EOR indicator bits as described before in accordance with an embodiment. The processor may be included in a decoder being configured to perform a decoding of the data stream according to a method described before. The processor register may be used to configure the decoding process performed by the processor. More in detail, the EE-bit 410 may indicate that a variable length code is used for encoding the data stream.

FIG. 6 shows the structure of a further processor register 500 in accordance with an embodiment. The first portion (dictionary origin) of the register comprises a pointer to the storage area in which the dictionary for decoding the data stream 100 is stored. In addition, the register comprises a further data portion (e.g. STT Offset) which points to a storage area comprising a description of the decoding scheme, e.g. the description of the code tree and a description of the EOR indicator used for padding the last block of the data stream. Specifically, the description of the EOR indicator may indicate how the EOR indicator is built (all zeros, all ones etc.) and the length of the EOR indicator (number of bits of the EOR indicator). By using said registers, the decoding scheme is hard-coded which increases the processing performance.

Methods for decoding an encoded data stream have been described which perform a padding of non-occupied bits of the last block based on partial EOR indicator. Technical effects and benefits of said methods can include that by adding a partial EOR indicator to the data stream instead of a full EOR indicator, the number of bits that must be added to the data stream and therefore the overhead can be significantly reduced.

The invention claimed is:

1. A computer-implemented method for modifying a digital data stream, the method comprising:
   segmenting, based on a certain block grid, the digital data stream, each block of the block grid comprising a fixed number of bits, the data stream comprising immediately consecutive code words of different length;
   determining whether all bits of a last block associated with the digital data stream are occupied by data of the digital data stream;
   based on determining that not all bits of the last block are occupied, padding the unoccupied bits of said last block with bits of a truncated end-of-record (EOR) indicator, the size of the truncated EOR varying based on the number of unoccupied bits of said last block; and
   based on determining that all bits of the last block are occupied, skip attaching a truncated EOR indicator to the digital data stream.

2. The computer-implemented method of claim 1, wherein the size of the block is a byte comprising eight bits.

3. The computer-implemented method of claim 1, wherein the code words are coded using a prefix-free code.

4. The computer-implemented method of claim 1, wherein the padding is performed by including two or more bits of the same bit value.

5. The computer-implemented method of claim 1, wherein the padding is performed by including two or more bits of a given bit sequence, said bit sequence being indicative for the EOR indicator.

6. The computer-implemented method of claim 1, wherein the modified data stream is stored in a storage having a storage granularity according to the block size.

7. A computer-implemented method for decoding an encoded data stream, the method comprising:
   receiving an encoded data stream with a certain length, the encoded data stream including multiple immediately consecutive code words of different length;
   processing the encoded data stream in order to detect valid code words;
   decoding detected valid code words;
   at the end of the data stream performing one of:
      investigating whether an end data portion is detected which is associated with a truncated EOR-indicator, the size of the truncated EOR indicator varying based on the number of unoccupied bits at the end of the data stream; and
      adding an EOR-indicator to the end of the data stream; and
   terminating the decoding process of the data stream based on one of detecting a truncated EOR-indicator and a complete EOR-indicator is detected at the end of the data stream.

8. The computer-implemented method of claim 7, wherein data blocks of the data stream comprising multiple bits are investigated in order to determine whether said data block contains a valid code word.

9. The computer-implemented method of claim 8, wherein the investigation regarding a valid code word is performed based on a look-up table or based on arithmetic operations and comparisons.

10. The computer-implemented method of claim 8, wherein the data blocks comprise a length equal to the length of the largest code word.

11. The computer-implemented method of claim 8, wherein the investigating regarding a valid code word is performed bitwise based on a code tree by moving along the code tree until a leaf of the code tree is reached which refers to a valid code word.

12. The computer-implemented method of claim 11, further comprising detecting at the end of the data stream whether a leaf of the code tree is reached which is associated with one of a valid code word, the EOR indicator, and the data stream ends at a point within the code tree which is on a branch towards the EOR indicator.

13. The computer-implemented method of claim 7, wherein the code words are coded by using a prefix-free code.

14. The computer-implemented method of claim 7, wherein the received encoded data stream is buffered.

15. A computer program product for decoding an encoded data stream, the computer program product comprising a computer readable storage medium having program instructions embodied therewith, the program instructions executable by a processor to cause the processor to perform:
   receiving an encoded data stream with a certain length, the encoded data stream including multiple immediately consecutive code words of different length;
   processing the encoded data stream in order to detect valid code words;
   decoding detected valid code words;
   at the end of the data stream performing one of:
      investigating whether an end data portion is detected which is associated with a truncated EOR-indicator, the size of the truncated EOR indicator varying based on the number of unoccupied bits at the end of the data stream; and
      adding an EOR-indicator to the end of the data stream; and
   terminating the decoding process of the data stream based on one of detecting a truncated EOR-indicator and a complete EOR-indicator is detected at the end of the data stream.

16. The computer program product of claim 15, wherein data blocks of the data stream comprising multiple bits are investigated in order to determine whether said data block contains a valid code word.

17. The computer program product of claim 16, wherein the investigation regarding a valid code word is performed based on a look-up table or based on arithmetic operations and comparisons.

18. The computer program product of claim 16, wherein the data blocks comprise a length equal to the length of the largest code word.

19. The computer program product of claim 16, wherein the investigating regarding a valid code word is performed bitwise based on a code tree by moving along the code tree until a leaf of the code tree is reached which refers to a valid code word.

20. The computer program product of claim 15, wherein the code words are coded by using a prefix-free code.

* * * * *